(12) United States Patent
Onitsuka et al.

(10) Patent No.: US 10,182,508 B2
(45) Date of Patent: Jan. 15, 2019

(54) ELECTRONIC COMPONENT HOUSING PACKAGE, MULTI-PIECE WIRING SUBSTRATE, AND METHOD FOR MANUFACTURING ELECTRONIC COMPONENT HOUSING PACKAGE

(71) Applicant: KYOCERA Corporation, Kyoto-shi, Kyoto (JP)

(72) Inventors: Yoshitomo Onitsuka, Kyoto (JP); Shuichi Kawasaki, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 37 days.

(21) Appl. No.: 15/527,861

(22) PCT Filed: Nov. 25, 2015

(86) PCT No.: PCT/JP2015/083059
§ 371 (c)(1),
(2) Date: May 18, 2017

(87) PCT Pub. No.: WO2016/084841
PCT Pub. Date: Jun. 2, 2016

(65) Prior Publication Data
US 2018/0324969 A1 Nov. 8, 2018

(30) Foreign Application Priority Data

Nov. 26, 2014 (JP) .................. 2014-238928
May 18, 2015 (JP) .................. 2015-101057

(51) Int. Cl.
*H05K 1/18* (2006.01)
*H05K 5/06* (2006.01)
(Continued)

(52) U.S. Cl.
CPC ......... *H05K 5/066* (2013.01); *H01L 21/4817* (2013.01); *H01L 23/057* (2013.01);
(Continued)

(58) Field of Classification Search
CPC ............................ H05K 1/181; H05K 5/066
See application file for complete search history.

(56) References Cited

FOREIGN PATENT DOCUMENTS

| | | |
|---|---|---|
| JP | 54-072472 U1 | 5/1979 |
| JP | 64-027248 A | 1/1989 |

(Continued)

OTHER PUBLICATIONS

International Search Report, PCT/JP2015/083059, dated Feb. 16, 2016, 2 pgs.

*Primary Examiner* — Jeremy C Norris
(74) *Attorney, Agent, or Firm* — Volpe and Koenig, P.C.

(57) ABSTRACT

An electronic component housing package includes an insulating substrate having an upper surface including a mount for an electronic component, a frame-shaped metallized layer surrounding the mount on the upper surface of the insulating substrate, and a metal frame joined to the frame-shaped metallized layer with a brazing material. The frame-shaped metallized layer includes a first sloping portion sloping inwardly from an upper surface to an inner peripheral surface. The brazing material includes a fillet portion formed between an upper outer periphery of the frame-shaped metallized layer and the metal frame, and a filling portion formed between the first sloping portion and the metal frame.

11 Claims, 9 Drawing Sheets

(51) Int. Cl.
    *H01L 23/10*           (2006.01)
    *H01L 23/00*           (2006.01)
    *H01L 21/48*           (2006.01)
    *H03H 9/19*            (2006.01)
    *H03H 3/02*            (2006.01)
    *H03H 9/10*            (2006.01)
    *H03H 9/02*            (2006.01)
    *H03H 3/08*            (2006.01)
    *H05K 3/00*            (2006.01)
    *H01L 23/057*         (2006.01)
    *H03B 5/32*            (2006.01)

(52) U.S. Cl.
    CPC ............ *H01L 23/10* (2013.01); *H01L 23/564* (2013.01); *H03H 3/02* (2013.01); *H03H 3/08* (2013.01); *H03H 9/02937* (2013.01); *H03H 9/1071* (2013.01); *H03H 9/19* (2013.01); *H05K 1/181* (2013.01); *H05K 3/0052* (2013.01); *H03B 5/326* (2013.01); *H05K 2201/10083* (2013.01); *H05K 2201/10424* (2013.01); *H05K 2203/107* (2013.01)

(56) References Cited

FOREIGN PATENT DOCUMENTS

| | | |
|---|---|---|
| JP | 2889519 B2 | 5/1999 |
| JP | 2003-017604 A | 1/2003 |
| JP | 2004-179408 A | 6/2004 |
| JP | 2004-281545 A | 10/2004 |
| JP | 2006-173287 A | 6/2006 |
| JP | 2008-192922 A | 8/2008 |
| JP | 2013-236038 A | 11/2013 |

ELECTRONIC COMPONENT HOUSING PACKAGE, MULTI-PIECE WIRING SUBSTRATE, AND METHOD FOR MANUFACTURING ELECTRONIC COMPONENT HOUSING PACKAGE

FIELD

The present invention relates to an electronic component housing package on which an electronic component is to be mounted, a multi-piece wiring substrate including multiple longitudinally and laterally arranged wiring board portions that are to be electronic component housing packages, and a method for manufacturing an electronic component housing package.

BACKGROUND

An electronic component housing package (hereafter, a package) known in the art for housing an electronic component, such as a semiconductor device or a surface acoustic wave device, includes an insulating substrate, which is formed from sintered ceramic such as sintered aluminum oxide or sintered glass ceramic, and a recessed mount formed on the insulating substrate for housing an electronic component. The insulating substrate typically includes a rectangular flat base, and a rectangular frame body arranged on the upper surface of the base in a manner to surround the mount. The upper surface of the frame body is joined to a metal frame (also referred to as a seal ring) with a frame-shaped metallized layer and a brazing material. The upper surface of the base and the inner surfaces of the frame body and the metal frame define the recessed mount. A metal lid is joined to the upper surface of the metal frame to hermetically seal the mount (and the electronic component on the mount).

Such packages are manufactured typically using a multi-piece wiring substrate, or specifically by obtaining multiple packages collectively at a time from a single, large-area mother substrate. The multi-piece wiring substrate includes a mother substrate including multiple longitudinally and laterally arranged wiring board portions that are to be individual packages. The mother substrate is formed from, for example, sintered aluminum oxide. The mother substrate has, on its main surface, or for example on its upper surface, separation grooves formed along the boundaries of the wiring board portions. The mother substrate receives bending stress applied across the separation grooves, and then snaps and separates into individual packages. The separation grooves are cut, for example, in the upper and lower surfaces of an unfired mother substrate. Each groove is cut to a predetermined depth in the boundary between adjoining wiring board portions with a tool such as a cutter blade (refer to Japanese Unexamined Patent Application Publication No. 2006-173287).

Individual packages have become smaller recently. For example, packages fabricated recently have the dimensions of, for example, 1.6 mm by 1.2 mm or less as viewed from above. A smaller package includes a very narrow frame body, as well as a narrow portion between its mount and the external environment (a narrow frame body and a narrow metal frame) (or in other words a frame body and a metal frame each having a small distance between their outer and inner peripheries as viewed from above or having a small distance between their outer and inner side surfaces).

BRIEF SUMMARY

A smaller wiring board with a narrower frame body can lower the reliability of hermetical sealing of its mount (electronic component) from the external environment. This results from the narrower frame-shaped joint area between the metal frame and the upper surface of the insulating substrate (frame-shaped metallized layer) (the smaller distance across the joint surface between one end of the joint area adjacent to the mount and another end of the joint area adjacent the outer periphery).

An electronic component housing package according to one aspect of the present invention includes an insulating substrate having an upper surface including a mount for an electronic component, a frame-shaped metallized layer surrounding the mount on the upper surface of the insulating substrate, and a metal frame joined to the frame-shaped metallized layer with a brazing material. The frame-shaped metallized layer includes a first sloping portion sloping inwardly from an upper surface to an inner peripheral surface. The brazing material includes a fillet portion formed between an upper outer periphery of the frame-shaped metallized layer and the metal frame, and a filling portion formed between the first sloping portion and the metal frame.

A multi-piece wiring substrate according to another aspect of the present invention includes a mother substrate including a plurality of wiring board portions corresponding to a plurality of the electronic component housing packages according to the above aspect.

A method for manufacturing an electronic component housing package according to another aspect of the present invention includes preparing a continuous substrate as a mother substrate, where the continuous substrate includes a laminate including a plurality of longitudinally and laterally arranged wiring board portions and a frame-shaped metallized layer arranged on an upper surface of the laminate, each wiring board portion has an upper surface including a mount, and the frame-shaped metallized layer extends along a boundary between the wiring board portions and is convex upward in longitudinal section in a width direction, applying laser light to the continuous substrate through the frame-shaped metallized layer to form separation grooves in the upper surface of the laminate and to form a first sloping portion sloping inwardly from the upper surface to an inner peripheral surface, forming a fillet portion of a brazing material between an upper outer periphery of the frame-shaped metallized layer and a metal frame, and a filling portion that is filled with the brazing material between the first sloping portion and the metal frame, and joining the frame-shaped metallized layer to the metal frame with the brazing material, and separating the wiring board portions along the separation grooves.

An electronic component housing package according to one aspect of the present invention includes an insulating substrate having an upper surface including a mount for an electronic component, a frame-shaped metallized layer surrounding the mount on the upper surface of the insulating substrate, and a metal frame joined to the frame-shaped metallized layer with a brazing material. The frame-shaped metallized layer includes a first sloping portion sloping inwardly from an upper surface to an inner peripheral surface. The brazing material includes a fillet portion formed between an upper outer periphery of the frame-shaped metallized layer and the metal frame, and a filling portion formed between the first sloping portion and the metal frame. The fillet portion and the filling portion of the brazing material allow the metal frame to be firmly joined to the frame-shaped metallized layer across the outer peripheral surface and the lower surface. For a smaller insulating substrate, the brazing structure of a metal frame improves the hermetical sealing. The resultant electronic component housing package includes the mount with improved hermetical sealing.

A multi-piece wiring substrate according to another aspect of the present invention includes a mother substrate including a plurality of wiring board portions corresponding to a plurality of the electronic component housing packages with the above structure. This structure allows efficient manufacture of electronic component housing packages each including the mount with high hermetical sealing.

A method for manufacturing an electronic component housing package according to another aspect of the present invention includes preparing a continuous substrate as a mother substrate, where the continuous substrate includes a laminate including a plurality of longitudinally and laterally arranged wiring board portions and a frame-shaped metallized layer arranged on an upper surface of the laminate, each wiring board portion has an upper surface including a mount, and the frame-shaped metallized layer extends along a boundary between the wiring board portions and is convex upward in longitudinal section in a width direction, applying laser light to the continuous substrate through the frame-shaped metallized layer to form separation grooves in the upper surface of the laminate and to form a first sloping portion sloping inwardly from the upper surface to an inner peripheral surface, forming a fillet portion of a brazing material between an upper outer periphery of the frame-shaped metallized layer and a metal frame, and a filling portion that is filled with the brazing material between the first sloping portion and the metal frame, and joining the frame-shaped metallized layer to the metal frame with the brazing material, and separating the wiring board portions along the separation grooves. The fillet portion and the filling portion of the brazing material allow the metal frame to be firmly joined to the frame-shaped metallized layer across the outer peripheral surface and the lower surface. For a smaller insulating substrate, the brazing structure of a metal frame improves the hermetical sealing. The method thus allows manufacture of the electronic component housing package including the mount with improved hermetical sealing.

DETAILED DESCRIPTION

An electronic component housing package, a multi-piece wiring substrate, and a method for manufacturing an electronic component housing package according to one or more embodiments of the present invention will now be described with reference to the accompanying drawings.

Figure 1A:
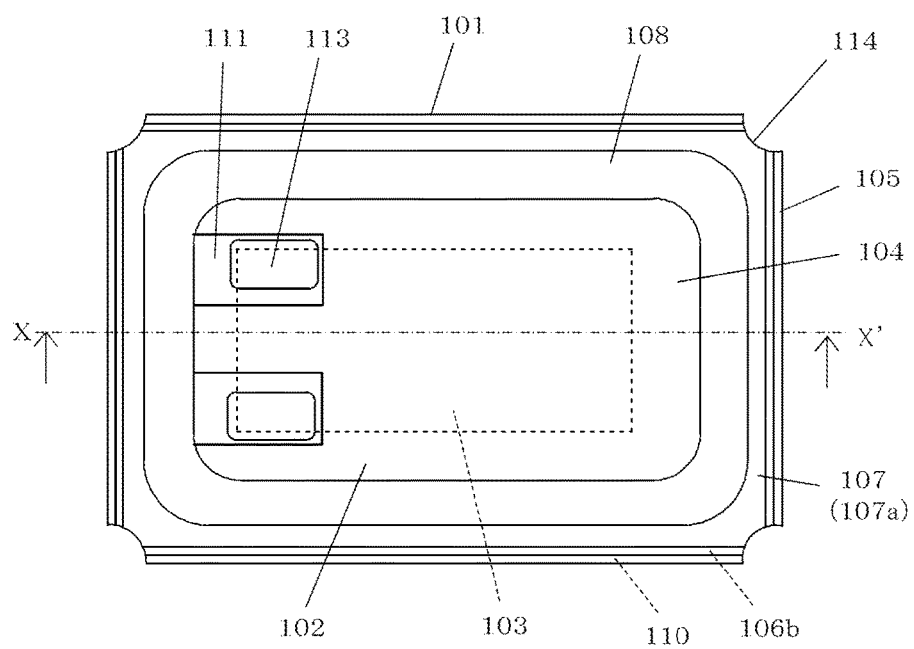
FIG. 1A is a top view of an electronic component housing package according to an embodiment of the present invention.
Figure 1B:
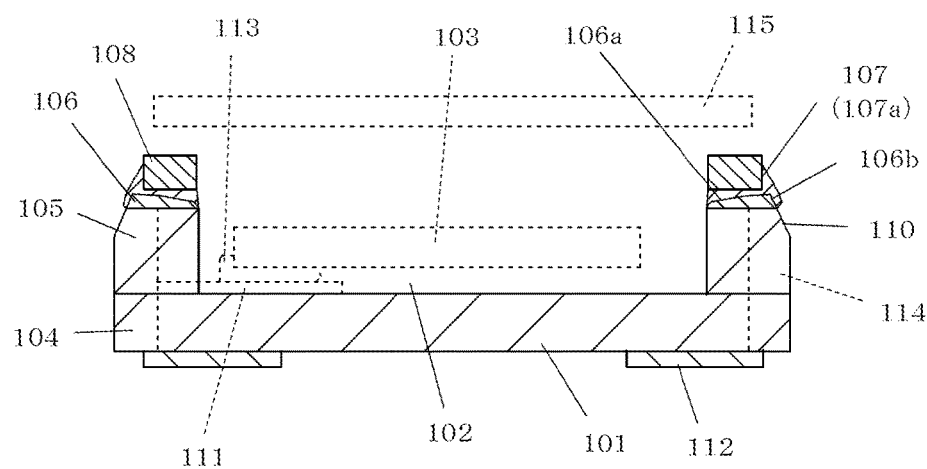
FIG. 1B is a cross-sectional view taken along line X-X' in FIG. 1A.
Figure 2:
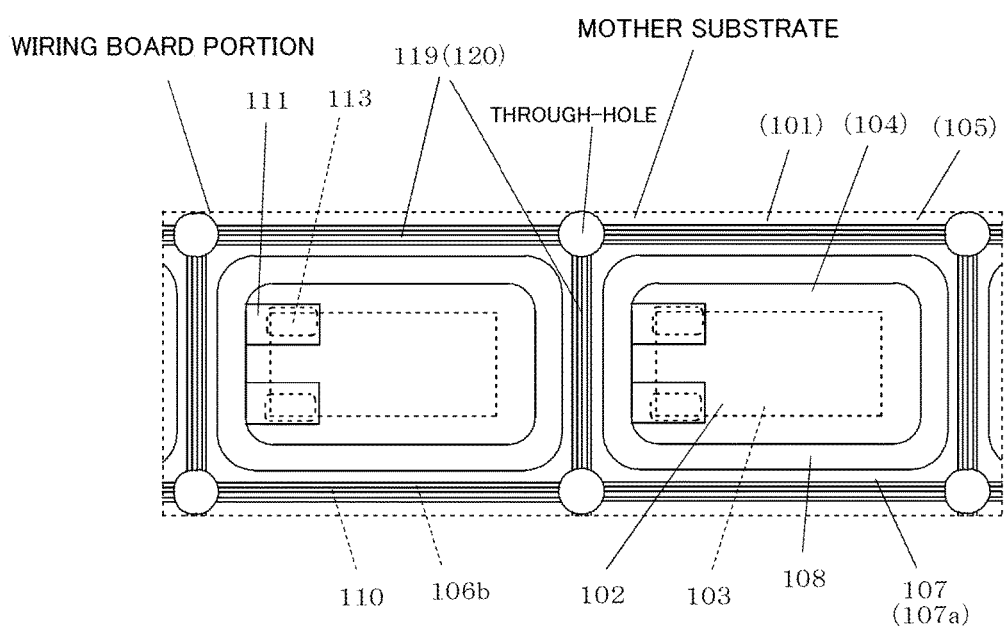
FIG. 2 is a partially enlarged top view of a multi-piece wiring substrate according to the embodiment of the present invention.
Figure 3:
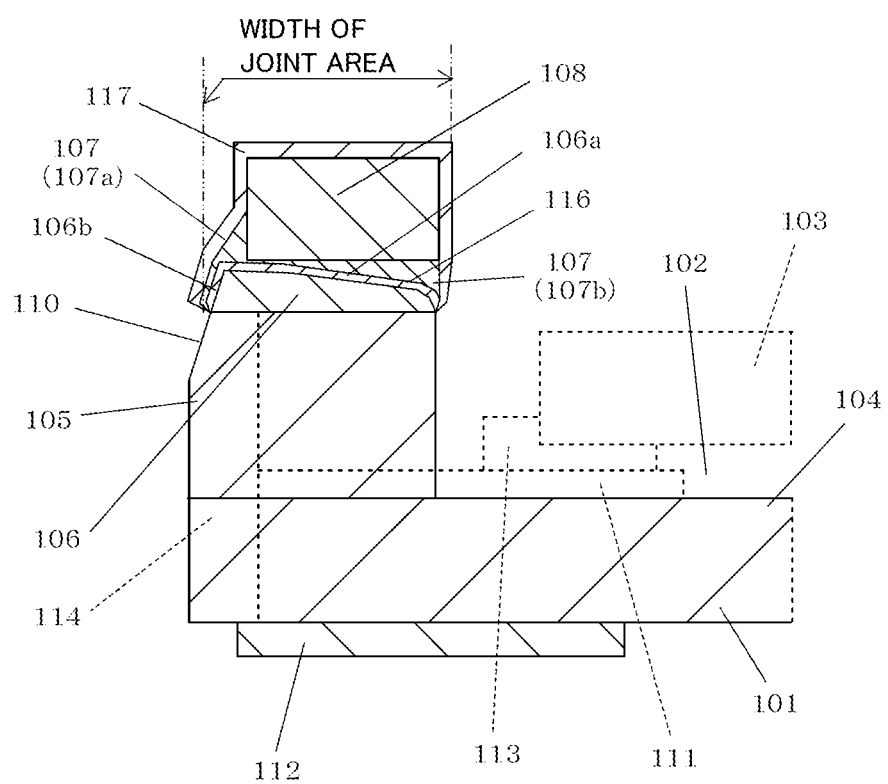
FIG. 3 is an enlarged cross-sectional view of a main part of the electronic component housing package according to the embodiment of the present invention.
Figure 4:
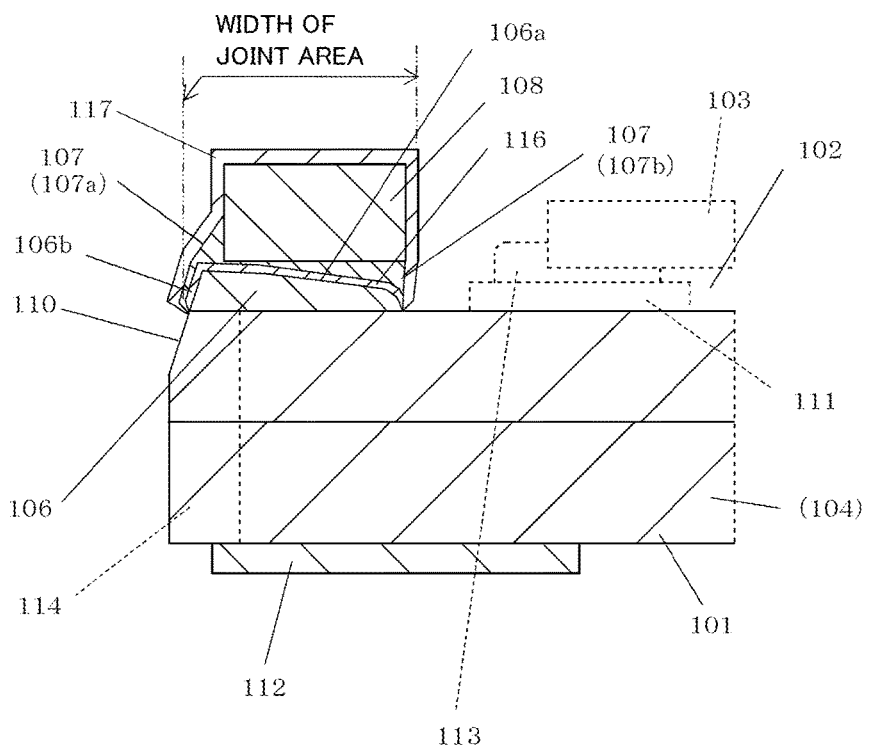
FIG. 4 is a cross-sectional view of a modification of the package shown in FIG. 3.

FIG. 1A is a top view of an electronic component housing package according to an embodiment of the present invention. FIG. 1B is a cross-sectional view taken along line X-X' of FIG. 1A. FIG. 2 is a partially enlarged top view of a multi-piece wiring substrate according to the embodiment of the present invention. FIG. 3 is a cross-sectional view of a main part of the electronic component housing package shown in FIGS. 1A and 1B. FIG. 4 is a cross-sectional view of a modification of the package shown in FIG. 3. FIGS. 9A to 9D are schematic cross-sectional views sequentially illustrating main processes of a method for manufacturing the electronic component housing package shown in FIGS. 1A and 1B.

In FIGS. 1A to 9D, an insulating substrate 101 included in an electronic component housing package has an upper surface including a recessed mount 102 for housing an electronic component 103. The insulating substrate 101 includes a base 104 and a frame body 105 arranged on the base 104. The upper surface of the frame body 105 is covered with a frame-shaped metallized layer 106. The frame-shaped metallized layer 106 is joined to a metal frame 108 with a brazing material 107. The frame-shaped metallized layer 106 includes a first sloping portion 106a that extends from the upper surface to the inner peripheral surface. The frame-shaped metallized layer 106 also includes a second sloping portion 106b on its outer surface. The frame body 105 has, on its outer peripheral surface, a third sloping portion 110 continuous to the second sloping portion. The electronic component housing package also includes a wiring conductor 111 and an external connection conductor 112. The electronic component 103 is joined to the electronic component housing package with a bond 113 to form an electronic device. The electronic component housing package or the electronic device in this example further includes castellations 114 at the corners of the insulating substrate 101, a lid 115 sealing the mount 102, a first nickel plating layer 116 and a second nickel plating layer 117 covering the exposed surface of the metal frame 108, and other elements. As described later in other examples shown in FIGS. 4 and 7, the package may include a flat insulating substrate 101 without a frame body, and a frame-shaped metallized layer 106 formed on the flat insulating substrate 101.

The electronic component housing package shown in FIGS. 1A and 1B may be fabricated using, for example, a multi-piece wiring substrate including a mother substrate having multiple areas that are to be electronic component housing packages (wiring board portions). FIG. 2 shows a main part of the multi-piece wiring substrate. In this example, laser light (hereafter simply, laser) 118 is applied to wiring board boundaries 119, each of which defines a boundary between wiring board portions, to form separation grooves 120.

The electronic component housing package includes the insulating substrate 101, which includes the frame body 105 arranged on the upper surface of the rectangular flat base 104. The upper surface of the frame body 105 is covered with the frame-shaped metallized layer 106. The frame-shaped metallized layer 106 is joined to the metal frame 108. The wiring conductor 111 in a predetermined pattern is formed either inside or on the surface of the insulating substrate 101 as appropriate. This is the basic structure of the electronic component housing package.

The insulating substrate 101 is formed from, for example, sintered ceramic such as sintered aluminum oxide, sintered glass ceramic, sintered aluminum nitride, sintered silicon carbide, sintered silicon nitride, or sintered mullite.

The insulating substrate 101 is prepared by firing a laminate of multiple ceramic insulating layers. For example, the insulating substrate 101 may be formed from sintered aluminum oxide with the procedure described below. First, the powders of raw materials containing glass elements, such as aluminum oxide and silicon oxide, are mixed with an appropriate organic solvent and an appropriate binder, and then shaped into multiple ceramic green sheets. Some of the ceramic green sheets are each shaped into a frame by punching. These frame-shaped ceramic green sheets are laminated onto the other flat ceramic green sheets without punching. This laminate is fired to prepare the insulating substrate 101 including the integrated multiple ceramic insulating layers (the ceramic insulating layers have no reference numeral). The punched ceramic green sheets form the frame body 105, whereas the ceramic green sheets without punching form the base 104.

The insulating substrate 101 in the electronic component housing package includes the mount 102 (recess) in the middle of its upper surface. The mount 102 allows the electronic component 103 to be mounted on the insulating substrate 101. The base 104 and the frame body 105 function as a container for protecting the electronic component 103 placed in the mount 102. Examples of the electronic component 103 to be placed in the mount 102 include a piezoelectric vibrator such as a quartz oscillator, a surface acoustic wave device, a semiconductor device such as a semiconductor integrated circuit (IC) device, a capacitive element, an inductor element, a resistor and other various components.

When, for example, the electronic component 103 is a quartz oscillator and the electronic device is a quartz device, the electronic component housing package with the above structure may be used for housing an oscillator that provides frequency and time references in an electronic device including a communication device, such as a mobile phone or a smartphone, or an information device, such as a computer or an IC card. The electronic device in this case is used as an oscillator. The electronic component placed in the mount is electrically connected to the wiring conductor 111 with the bond 113, such as a conductive adhesive.

The electronic component housing package may be one of individual pieces obtained by preparing a multi-piece wiring substrate and separating the multi-piece wiring substrate. In this case, for example, a mother substrate, which is a laminate of multiple ceramic insulating layers, is prepared to have multiple longitudinally and laterally arranged wiring board portions each having the mount 102 (each portion to be the insulating substrate 101). The separation grooves 120 are formed on the upper surface of the mother substrate along the wiring board boundaries 119 to complete the basic structure of the multi-piece wiring substrate shown in, for example, FIG. 2. This mother substrate is then separated into individual pieces along the wiring board boundaries 119 to obtain electronic component housing packages with the structure shown in, for example, FIGS. 1A and 1B.

To help separate the multi-piece wiring substrate into individual pieces, the separation grooves 120 are formed along the wiring board boundaries 119 on both the upper surface and the lower surface of the mother substrate (the separation grooves on the lower surface are not shown in FIG. 2). Stress is applied onto the areas around the separation grooves 120 (wiring board boundaries 119) of the mother substrate. The mother substrate then snaps in the thickness direction, and separates into individual pieces, each of which is the insulating substrate 101.

The wiring conductor 111 is formed inside and on the surface of the insulating substrate 101 to extend from the bottom of the mount 102 to the lower surface of the insulating substrate 101. A portion of the wiring conductor 111 formed on the lower surface of the insulating substrate is, for example, the external connection conductor 112 located on the outer periphery of the lower surface. Another portion of the wiring conductor 111 formed inside the insulating substrate 101 is a feedthrough conductor (e.g., a via conductor) or an internal wiring layer. The electronic component 103 placed in the mount 102 is electrically connected to the wiring conductor 111 to electrically connect the electronic component 103 to an external electric circuit (not shown) through the wiring conductor 111 and the external connection conductor 112.

The wiring conductor 111 is formed from a metal material, such as copper, silver, palladium, gold, platinum, tungsten, molybdenum, or manganese, or an alloy of two or more of these metals. To form the wiring conductor 111 from, for example, molybdenum, which is a refractory metal, a metal paste (not shown) prepared by mixing powdery molybdenum with an organic solvent and a binder is applied in a predetermined pattern onto the laminate of ceramic green sheets that are to be the insulating substrate 101. The ceramic green sheets with the metal paste are then collectively fired to form the wiring conductor 111.

In the above multi-piece wiring substrate, each wiring board portion has a metallized conductor layer covering the outer periphery of its upper surface. The metallized conductor layer is formed into the frame-shaped metallized layer 106 of each electronic component housing package after the separation. Each frame-shaped metallized layer 106 may have its outer periphery in contact with the corresponding separation grooves 120.

The frame-shaped metallized layer 106 is formed from, for example, a metal such as tungsten or molybdenum. To form the frame-shaped metallized layer 106 using, for example, a metallized conductor layer of molybdenum, a metal paste prepared by mixing powdery molybdenum with an organic solvent and a binder is printed in a predetermined pattern on the upper surface of the laminate of the ceramic green sheets that are to be the ceramic insulating layers (frame body 105). The metal paste is formed by, for example, screen printing to form the fired frame-shaped metallized layer 106 with a thickness of about 8 to 20 μm.

The upper surface of the frame-shaped metallized layer 106 is further joined to the metal frame 108 with the brazing material 107. The frame-shaped metallized layer 106 may be joined to the metal frame 108 either before or after the multi-piece wiring substrate is separated into individual electronic component housing packages (insulating substrates 101). For better productivity, this joining process is performed before the multi-piece wiring substrate is separated. As described later, the metal lid 115 is then joined to the metal frame 108 to seal the mount 102.

In the example of this embodiment, a nickel plating layer (the entire nickel layer has no reference numeral) and a gold plating layer (not shown) are deposited one after the other on the exposed surface of the frame-shaped metallized layer 106 and the metal frame 108. The nickel plating layer on the frame-shaped metallized layer 106 is shown, whereas a nickel plating layer on the wiring conductor 111 is not shown.

The electronic component housing package includes the frame-shaped metallized layer 106 with the first sloping portion 106a sloping inwardly from its upper surface toward its inner peripheral surface. The package also includes a fillet portion 107a of the brazing material 107 formed between the upper outer periphery of the frame-shaped metallized layer 106 and the metal frame 108, and a filling portion 107b of the brazing material 107 formed between the first sloping portion 106a and the metal frame 108. This structure allows the metal frame 108 to be firmly joined to the frame-shaped metallized layer 106.

More specifically, the frame-shaped metallized layer 106 has the first sloping portion 106a sloping inwardly from its upper surface toward its inner peripheral surface. The fillet portion 107a of the brazing material 107 is formed between the upper outer periphery of the frame-shaped metallized layer 106 and the outer peripheral surface of the metal frame 108, whereas the filling portion 107b filled with the brazing material 107 is formed between the first sloping portion 106a and the lower surface of the metal frame 108. The fillet portion 107a and the filling portion 107b of the brazing material 107 allow the metal frame 108 to be firmly joined to the frame-shaped metallized layer 106 across the outer peripheral surface and the lower surface. For any smaller insulating substrate 101, the brazing structure of the metal frame 108 improves the hermetical sealing. The resultant electronic component housing package includes the mount 102 with improved hermetical sealing.

The first sloping portion 106a extending from the upper surface of the frame-shaped metallized layer 106 to the inner peripheral surface may be formed with the procedure described below. To prepare a multi-piece wiring substrate, multiple frame-shaped metallized layers 106 are first formed on wiring board portions on the upper surface of a laminate (unfired) that is to be a mother substrate. The frame-shaped metallized layers 106 on adjoining wiring board portions are formed integrally by screen printing (with the laterally adjoining frame-shaped metallized layers 106 covering the frame bodies 105 being integral to one another).

The common integrated frame-shaped metallized layers 106 on the two wiring board portions each are convex upward in the middle in the width direction (the direction from the inner periphery of the mount 102 on one wiring board portion to the inner periphery of the mount 102 on the other wiring board portion) under the surface tension of the metal paste that is to be the frame-shaped metallized layers 106. The convex shape may be adjusted as appropriate by changing, for example, the viscosity of the metal paste used in the screen printing. The viscosity of the metallization paste or the conditions for the screen printing may be changed as appropriate to adjust the printed shape of the frame-shaped metallized layers 106. The convex tends to be higher in the middle in the width direction as the width of the frame-shaped metallized layers 106 is smaller. In other words, the trend toward smaller sizes allows easy preparation of each frame-shaped metallized layer 106 with its thickness increasing from the mount 102 toward the outer periphery.

In this laminate, the center line of each integrated frame-shaped metallized layer 106 in the width direction (the wiring board boundary 119) is irradiated with the laser 118 in focus to form the separation grooves 120 each including the second sloping portion 106b and the third sloping portion 110. The resultant wiring board portions each include the frame-shaped metallized layer 106 including the first sloping portion 106a sloping inwardly from the upper surface of the frame-shaped metallized layer 106 toward the inner peripheral surface. The laminate including the separation grooves 120 is then collectively fired to form the mother substrate.

The frame-shaped metallized layer 106 in each electronic component housing package also includes the second sloping portion 106b sloping outwardly from the upper end of its outer peripheral surface toward the lower end. The second sloping portion 106b of the frame-shaped metallized layer 106 is covered with the brazing material 107, which joins the frame-shaped metallized layer 106 to the metal frame 108. For any smaller insulating substrate 101 with the frame body 105 narrower in the width direction, the electronic component housing package with this structure allows high hermetical sealing of the mount 102.

More specifically, the frame-shaped metallized layer 106 includes the second sloping portion 106b on its outer peripheral surface, which is covered with the brazing material 107. In this structure, the brazing material 107 spreads over an area larger than in structures known in the art from the outer surface of the metal frame 108 to the outer peripheral surface of the frame-shaped metallized layer 106. Thus, the joint area between the frame-shaped metallized layer 106 and the metal frame 108 with the brazing material 107 (or the joint area in FIGS. 3 and 4) can be wider in appearance. More specifically, the width of the joint area between the metal frame 108 and the frame-shaped metallized layer 106 (the distance from the inner periphery to the outer periphery of the joint between the metal frame 108 and the frame-shaped metallized layer 106 along the joint surface) can be effectively designed larger than in structures known in the art. In other words, the joint, which can possibly cause external air to pass through and reach the mount 102 due to poor wetting of the brazing material 107, can easily be designed longer than in structures known in the art. This structure thus improves the hermetical sealing of the mount 102. The resultant electronic component housing package includes the mount 102 with high hermetical sealing.

The second sloping portion 106b on the outer peripheral surface of the frame-shaped metallized layer 106 and the third sloping portion 110 on the outer peripheral surface of the insulating substrate 101 (the upper end of the frame body 105) may be formed with the procedure described below. When the electronic component housing packages are fabricated using the multi-piece wiring substrate as described above, the upper surface of the mother substrate having multiple longitudinally and laterally arranged wiring board portions is irradiated with laser 118 to form the separation grooves 120 along the wiring board boundaries 119. The processing with the laser 118 will be described in detail later (refer to FIGS. 9A to 9D). The laser application forms each groove 120 with inner surfaces sloping downwardly from the upper end of the frame-shaped metallized layer 106 and the insulating substrate 101. This frame-shaped metallized layer 106 covers both the adjoining wiring board portions. In other words, the frame-shaped metallized layer 106 also covers a portion of the wiring board boundary 119 (in which the separation groove 120 is formed). The sloping inner surfaces of the formed groove 120 correspond to the second sloping portion 106b and the third sloping portion 110.

In this case, each separation groove 120 is formed with the laser 118 when the substrate is a laminate of multiple ceramic sheets, or an unfired laminate that is to be a mother substrate. Forming the separation grooves 120 in the unfired laminate with the laser 118 provides good processability and avoids adhesion of a melt resulting from the laser processing.

More specifically, the laser may be an ultraviolet (UV) laser, a green laser, or an infrared (IR) laser. The output of these lasers per unit area (unit area of a workpiece spot irradiated with the laser) is relatively small, and the laser processing generates a small amount of melt. In this case, the unfired frame-shaped metallized layer 106 containing organic substances such as a binder is more easily removed by the laser processing than the frame-shaped metallized layer 106 fired on the mother substrate (sintered metal). Thus, any of such relatively small power lasers can be used to form the second sloping portion 106b with an intended shape. The separation grooves 120 may also be formed on the lower surface at positions overlapping the separation grooves 120 on the upper surface as viewed from above. This eases the separation of the mother substrate further.

In the electronic component housing package, the second sloping portion 106b of the frame-shaped metallized layer 106 corresponds to the outer periphery of the upper surface of the insulating substrate 101. The insulating substrate 101 may have, on its outer peripheral surface, the third sloping portion 110 continuous to the second sloping portion 106b. In the multi-piece wiring substrate, for example, this structure easily provides enough space between the frame-shaped metallized layers 106 on adjoining wiring board portions of the mother substrate. The frame-shaped metallized layers 106 on the adjoining wiring board portions are thus prevented from joining to each other with the brazing material 107. Thus, the mother substrate having smaller wiring board portions for smaller individual electronic component housing packages can snap in the thickness direction, and can thus be separated in an appropriate manner. The multi-piece wiring substrate with this structure can be used to provide electronic component housing packages with accurate outer dimensions and high hermetical sealing of the mount 102.

The electronic component housing packages with the third sloping portion 110 of the outer peripheral surface of the insulating substrate 101 continuous to the second sloping portion 106b of the frame-shaped metallized layer 106 may be fabricated from the multi-piece wiring substrate having the separation grooves 120 formed by laser processing under the same conditions as described in the above example. The conditions of the laser processing include, for example, a pulse frequency of 100 to 1000 kHz, a pulse width of 50 ps or less, and an average output of 50 W, or preferably about 20 W. The conditions may be optimized in accordance with the pulse characteristics of the laser 118 and the processability of the workpiece.

More specifically, when multiple electronic component housing packages are fabricated from a multi-piece wiring substrate, the laser 118 may be applied to the frame-shaped metallized layer 106 on the unfired laminate to form V-shaped separation grooves 120 in the areas of the wiring board boundaries 119. This processing forms the second sloping portion 106b and the third sloping portion 110 continuous to the second sloping portion 106b at a time at each wiring board boundary 119 (area to be the outer peripheral surface of each wiring board). The separation grooves 120 are formed on the multi-piece wiring substrate using laser processing with high positional accuracy. This method enables surface processing of fine patterns in micro areas, unlike conventional mechanical machining using, for example, a cutter blade. This improves the productivity of ultra-small electronic component housing packages.

In particular, laser processing with a narrow pulse width has high reliability and generates less heat in the processed workpiece. This method thus forms the separation grooves 120 with a width of tens of micrometers through micromachining while generating little melt. Each wiring board portion on the mother substrate is, for example, a quadrangle with one side of about 1.0 to 3.2 mm. Each wiring board portion has the outer periphery corresponding to the boundaries 119 between multiple wiring board portions. The separation grooves 120 are formed at the boundaries 119 between the multiple wiring board portions on the upper surface of the mother substrate.

The mother substrate is formed basically from the same material as the insulating substrate 101 of each individual electronic component housing package. More specifically, the mother substrate is formed from, for example, a sintered ceramic material containing, as its major constituent, alumina, silicon nitride, aluminum nitride, silicon carbide, mullite, ferrite, or glass ceramic as described above. Multiple ceramic insulating layers (the ceramic insulating layers have no reference numeral) each having a thickness of, for example, about 50 to 200 µm are formed from the material. A laminate of these ceramic insulating layers is formed with a thickness of, for example, 150 to 500 µm. The mother substrate may contain at least one metallic oxide selected from the group consisting of Mg, Mn, Co, Cr, Cu, Ni, and Fe as a constituent for increasing the laser absorptivity.

A mother substrate formed from a sintered ceramic material containing alumina as its major constituent may contain 92% by mass of $Al_2O_3$ as its major constituent, and 3% by mass of $SiO_2$, 3.5% by mass of $Mn_2O_3$, 1% by mass of MgO, and 0.5% by mass of $MoO_3$ as sintering agent constituents. Another mother substrate may contain 90.5% by mass of $Al_2O_3$ as its major constituent, and 1.5% by mass of $SiO_2$, 2.5% by mass of $Mn_2O_3$, 1% by mass of MgO, 1% by mass of $TiO_2$, and 3.5% by mass of CrO as sintering agent constituents. Another mother substrate may contain 93% by mass of $Al_2O_3$ as its major constituent, and 2% by mass of $SiO_2$, 3% by mass of $Mn_2O_3$, 1% by mass of MgO, and 1% by mass of $MoO_3$ as sintering agent constituents.

The frame-shaped metallized layer 106 in the electronic component housing package may have a thickness increasing from the mount 102 toward the outer periphery. This structure allows a part of the frame-shaped metallized layer 106 adjacent to the outer periphery to have a sufficiently larger thickness, and effectively enables stronger metallization. The resultant electronic component housing package includes the frame-shaped metallized layer 106 that is less likely to come off the insulating substrate 101.

The frame-shaped metallized layer 106 with its thickness increasing from the mount 102 toward the outer periphery may be formed in the same manner as for the first sloping portion 106a. To prepare a multi-piece wiring substrate, multiple frame-shaped metallized layers 106 are first formed on wiring board portions on the upper surface of a laminate (unfired) that is to be a mother substrate. The frame-shaped metallized layers 106 on adjoining wiring board portions are formed integrally by screen printing (with the laterally adjoining frame-shaped metallized layers 106 covering the frame bodies 105 being integral to one another).

The common integrated frame-shaped metallized layers 106 on the two wiring board portions each are convex upward in the middle in the width direction (the direction from the inner periphery of the mount 102 on one wiring board portion to the inner periphery of the mount 102 on the other wiring board portion) under the surface tension of the metal paste that is to be the frame-shaped metallized layers 106. The convex shape may be adjusted as appropriate by changing, for example, the viscosity of the metal paste used in the screen printing. The viscosity of the metallization paste or the conditions for the screen printing may be changed as appropriate to adjust the printed shape of the frame-shaped metallized layers 106. The convex tends to be higher in the middle in the width direction as the width of the frame-shaped metallized layers 106 is smaller. In other words, the trend toward smaller sizes allows easy preparation of each frame-shaped metallized layer 106 with its thickness increasing from the mount 102 toward the outer periphery.

The frame-shaped metallized layer 106 is formed to have a thickness of, for example, about 5 to 10 μm in its relatively thin portion after firing. The frame-shaped metallized layer 106 has a thickness of about 10 to 20 μm in its relatively thick portion.

In this laminate, the center line of each integrated frame-shaped metallized layer 106 in the width direction (the wiring board boundary 119) is irradiated with the laser 118 in focus to form the separation grooves 120 each including the second sloping portion 106b and the third sloping portion 110. The resultant wiring board portion includes the frame-shaped metallized layer 106 with its thickness increasing from the mount 102 toward the outer periphery. The laminate including the separation grooves 120 is then collectively fired to form the mother substrate.

The plating layer of, for example, nickel covering the frame-shaped metallized layer 106 intends to prevent oxidation or corrosion of the metal such as the exposed frame-shaped metallized layer 106 and to improve the wettability and the joining strength in, for example, brazing. The plating layer may a multilayer including, for example, a lower nickel plating layer and an upper gold plating layer.

An example of the plating layer will now be described. The first nickel plating layer 116 is first deposited on an exposed surface, such as the upper surface, of the frame-shaped metallized layer 106 (or surfaces excluding the interface with the insulating substrate 101) to improve the joining to the brazing material 107. The metal frame 108 integrated with the brazing material 107 is then placed, using a tool, on the upper surface of the frame-shaped metallized layer 106 on which the first nickel plating layer 116 has been deposited. The brazing material 107 is melted by heating in a reducing atmosphere to braze the frame-shaped metallized layer 106 with the metal frame 108. The second nickel plating layer 117 and the gold plating layer (not shown) are then deposited one after the other on the exposed surface of the brazed metal (exposed surface of, for example, the frame-shaped metallized layer 106, the wiring conductor 111, or the metal frame 108) to improve the corrosion resistance and the joining with solder.

For example, the first nickel plating layer 116 has a thickness of about 0.1 to 0.5 μm, the second nickel plating layer 117 has a thickness of about 1.0 to 20 μm, and the gold plating layer has a thickness of about 0.1 to 1.0 μm. The first nickel plating layer 116 is thinner. The metal frame 108 covers the frame-shaped metallized layer 106, and the second nickel plating layer 117 thus covers the exposed surfaces of each metal layer and the metal frame 108. Thus, the first nickel plating layer 116 may be thinner to simply function as a nickel plating underlayer for the brazing. These plating layers may be formed by, for example, electroplating using an electric current applied to an area to be plated (e.g., the surface of the frame-shaped metallized layer 106) in a plating solution.

As described above, the brazing material 107 covers the second sloping portion 106b of the frame-shaped metallized layer 106. The brazing material 107 also spreads on the lower surface and the outer peripheral surface of the metal frame 108. The brazing material 107 thus easily flows up from the outer surface of the second sloping portion 106b to the outer peripheral surface of the metal frame 108, and covers a larger joint area of the metal frame 108 than structures known in the art.

As in the example shown in FIG. 4, the package including the frame-shaped metallized layer 106 formed on the flat insulating substrate 101 without a frame body has the same advantageous effects as described above.

The electronic component housing package in the embodiment may have the castellations 114 (channel-like cutouts) at the corners of the side surfaces of the insulating substrate 101. Each castellation 114 functions as, for example, a space for receiving a side conductor (castellation conductor) (not shown).

Figure 5:
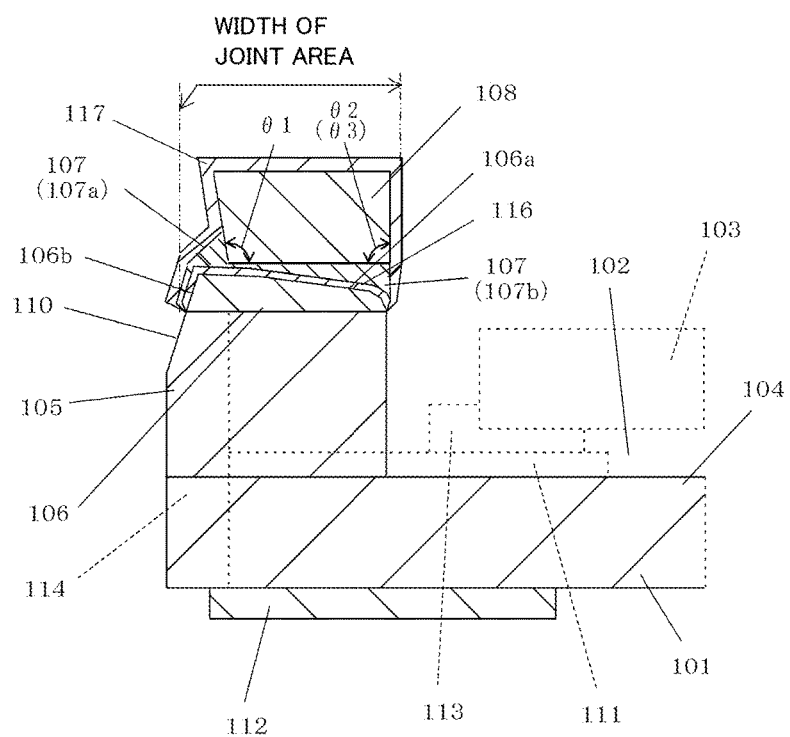
FIG. 5 is an enlarged cross-sectional view of a main part of another electronic component housing package according to the embodiment of the present invention.

In the electronic component housing package, the lower surface of the metal frame 108 is narrower than the upper surface as viewed in longitudinal section, and the outer peripheral surface of the metal frame 108 is tilted outwardly from the lower end to the upper end. This structure is shown in FIG. 5 (in which the tilt angle θ1 at the outer peripheral surface of the metal frame 108 is, for example, 93° to 105°). In this structure, when the metal frame 108 is joined to the frame-shaped metallized layer 106 with the brazing material 107, the tilt of the metal frame 108 prevents the brazing material 107 from flowing up the outer peripheral surface of the metal frame 108. More specifically, the brazing material 107 flowing up the outer peripheral surface of the metal frame 108 is reduced, and thus the brazing material 107 easily accumulates nearer the second sloping portion 106b formed on the outer periphery of the frame-shaped metallized layer 106. This increases the area joined with the brazing material 107. More specifically, the joint area between the metal frame 108 and the frame-shaped metallized layer 106 is effectively larger than in structures known in the art.

To form the metal frame 108 with the lower surface narrower than the upper surface in the cross-section of the mount 102, for example, a flat metal base (not shown) formed from, for example, an iron-nickel alloy or an iron-nickel-cobalt alloy, may be punched into a frame shape using a lower die and an upper die having adjusted clearances (gaps) between them.

More specifically, the lower die and the upper die may have a larger clearance between them at the outer periphery of the metal frame 108 to form a tilt. In this case, when the metal base is punched into a frame shape, the metal frame 108 can have a wider outer periphery at the end surface of punching than at the start surface of punching. Based on this principle, the metal frame 108 may be fabricated using its joint surface to the brazing material 107 as the punching start surface. The metal base may have its one side covered with a rolled layer of the brazing material 107. In this case, the metal base has its opposite side used as the punching end surface (to be placed in contact with the lower die). The upper die moves downwardly while pressing the brazing material 107 to punch the metal base into a frame shape. The resultant metal frame 108 is integral with the brazing material 107. This structure eases the process for brazing the metal frame 108 to the insulating substrate 101. When the metal base is punched into a frame shape, the lower die and the upper die have a smaller clearance between them at the inner periphery than at the outer periphery. The inner peripheral surface of the metal frame 108 is tilted inwardly from the lower end to the upper end by a smaller angle than the outer peripheral surface (the tilt angle θ2 at the inner peripheral surface of the metal frame 108 is, for example, 91° to 93°).

The metal frame 108 may also have its inner peripheral surface tilted inwardly from the lower end to the upper end and can thus have an inverted trapezoidal cross-section, in addition to its outer peripheral surface tilted outwardly from the lower end to the upper end. When, for example, the part of the metal frame 108 adjacent to the mount 102 is joined to the frame-shaped metallized layer 106 at a position deviated toward the outer periphery as viewed from above (with an exposed part of the inner periphery of the frame-shaped metallized layer 106), the brazing material 107 tends to easily flow up the side surface of the metal frame 108 adjacent to the mount 102, or up the inner peripheral surface. However, the structure with the outer peripheral surface tilted outwardly from the lower end to the upper end and the inner peripheral surface tilted inwardly from the lower end to the upper end prevents the brazing material 107 from flowing up the side surfaces of the metal frame 108. A sufficient amount of brazing material 107 accumulates, and increases the joint area. To ease mounting of an electronic component onto the mount 102, the inner peripheral surface of the metal frame 108 may be tilted less than the outer peripheral surface (the tilt angle θ3 at the inner peripheral surface of the metal frame 108 is, for example, 92° to 98°).

As shown in FIG. 5, the metal frame 108 has its lower surface narrower than its upper surface as viewed in longitudinal section. In other words, the upper surface is wider. This increases the area of the joint between the metal frame 108 and the lid 115. In a smaller electronic component housing package including an insulating substrate 101 with a narrower frame width, the metal frame 108 with the above shape can improve the reliability of the sealing between the electronic component housing package and the lid 115.

The outer periphery of the upper surface at the cross-section of the metal frame 108 may be located more inwardly than the brazing material 107 covering the second sloping portion 106*b* to prevent interference between adjoining wiring board portions when the mother substrate is separated into individual pieces.

Figure 6:
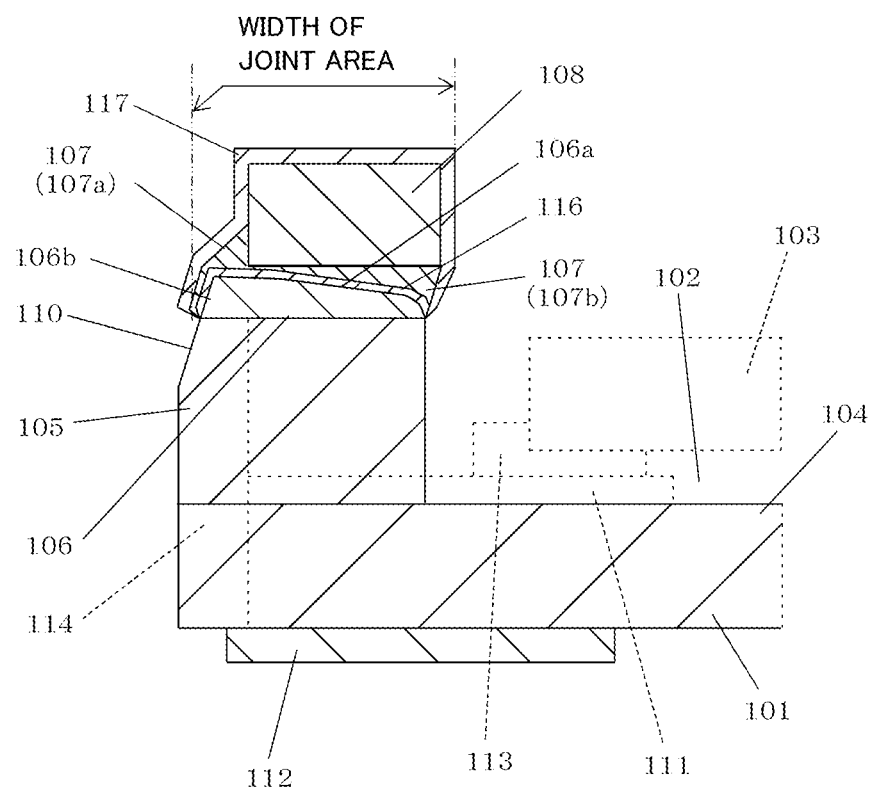
FIG. 6 is an enlarged cross-sectional view of a main part of another electronic component housing package according to the embodiment of the present invention.

In the electronic component housing package, the inner periphery of the metal frame 108 is located nearer the mount 102 than the inner periphery of the frame-shaped metallized layer 106. This structure is shown in FIG. 6. In this structure, a fillet portion of the brazing material 107 is also formed on a lower surface of the metal frame 108 adjacent to the mount 102. This increases the sealing width of the brazing material 107, and easily allows the brazing material 107 on the outer periphery to extend nearer the mount 102.

More specifically, the metal frame 108 located nearer the mount 102 causes the fillet portion of the brazing material 107 to have a smaller tilt on the outer periphery of the electronic component housing package. As a result, an excess amount of brazing material 107 does not accumulate on the outer periphery. This prevents the wiring board portions arranged on the mother substrate from joining to each other with the brazing material 107. In this structure, the frame-shaped metallized layer 106 is less is likely to come off under stress applied when the mother substrate is separated into individual pieces.

As described above, the metal frame 108 can be brazed to have its inner periphery nearer the mount 102 than the inner periphery of the frame-shaped metallized layer 106 with, for example, a method as described below. The metal frame 108 integrated with the brazing material 107 is placed, using a tool, on the upper surface of each frame-shaped metallized layer 106 formed on the fired mother substrate. The brazing material 107 is then melted by heating in a reducing atmosphere to braze the frame-shaped metallized layer 106 with the metal frame 108. For positioning of the metal frame 108, for example, multiple cutouts (not shown) are formed in the outer periphery of the mother substrate, and positioning pins for the tool are placed in the multiple cutouts for appropriate positioning of the metal frame 108 on the frame-shaped metallized layer 106 of each wiring board portion. This allows the metal frame 108 to be brazed to the frame-shaped metallized layer 106 of the wiring board portion with high positional accuracy.

The inner periphery of the metal frame 108 is nearer the mount 102 than the inner periphery of the frame-shaped metallized layer 106. Thus, as viewed from above, the inner side of the metal frame 108 is adjacent to the mount 102 without the frame-shaped metallized layer 106 located between the metal frame 108 and the mount 102. In other words, the inner periphery of the frame-shaped metallized layer 106 is hidden as viewed from above. Thus, when the electronic component 103 is mounted onto the mount 102 with, for example, the inner periphery of the metal frame 108 being used as a positional reference for the mount 102, the inner periphery of the frame-shaped metallized layer 106 cannot be erroneously detected as the positional reference for the mount 102. This allows more reliable mounting of the electronic component 103. This structure further prevents an area of the mount 102 adjacent to the metal frame 108 from being reduced by the frame-shaped metallized layer 106 (frame body 105) as viewed from above, and allows more reliable mounting of the electronic component 103.

More specifically, when, for example, a device for mounting the electronic component 103 determines the inner periphery of the metal frame 108 as a positional reference for the mount 102, an image recognizer recognizes the position of the mount 102 with the inner periphery of the metal frame 108 from above. The device then mounts the electronic component 103 onto the mount 102 based on the positional information about the mount 102. The electronic component 103 is thus connected to the wiring conductor 111. A slight positional deviation of the metal frame 108 can cause a part of the frame body 105 (frame-shaped metallized layer 106) to appear from behind the inner periphery of the metal frame 108 as viewed from above. The appearing part can be erroneously detected as the metal frame 108 and its positional information may be recorded. This causes inaccurate mounting of the electronic component 103 onto the mount 102.

However, when the metal frame 108 is nearer the mount 102 as described above, the frame-shaped metallized layer 106 does not appear between the metal frame 108 and the mount 102 as viewed from above. The inner side of the metal frame 108 is adjacent to the exposed mount 102. In this case, accurate positional information can be obtained by image recognition. The metal frame 108 has a plating layer of, for example, gold on its upper surface, whereas the exposed surface of the mount 102 is a ceramic surface. Thus, the metal frame 108 and the mount 102 have greatly different color tones as viewed from above. This allows easy image recognition of the mount 102.

The metal frame 108 joined to the frame-shaped metallized layer 106 may not be rectangular as viewed in cross-section in FIG. 6. The outer peripheral surface may be tilted outwardly from the lower end to the upper end, and/or the inner peripheral surface may be tilted inwardly from the lower end to the upper end. In this case, with the metal frame 108 having the lower surface narrower than the upper surface, the tilted surfaces of the metal frame 108 can prevent the brazing material 107 from flowing up the side surfaces of the metal frame 108 as described above. This increases the width of the area joined with the brazing material 107.

Figure 7:
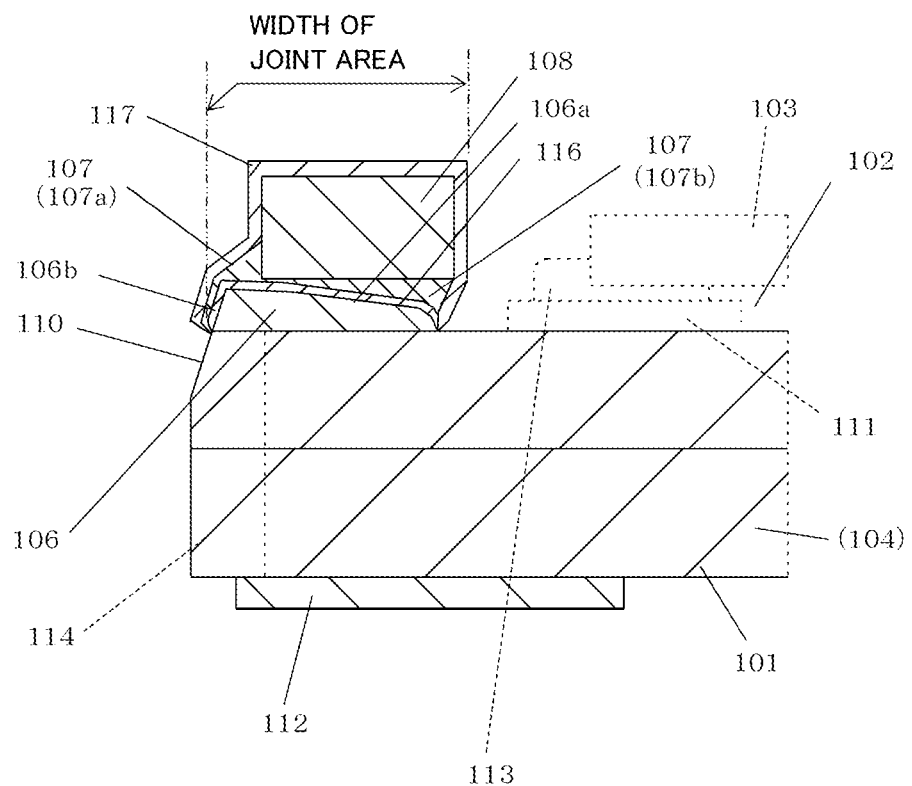
FIG. 7 is a cross-sectional view of a modification of the package shown in FIG. 6.

In the metal frame 108 with the inner peripheral surface tilted inwardly from the lower end to the upper end, and the outer peripheral surface tilted outwardly from the lower end to the upper end, the inner periphery of the frame body 105 and the inner periphery of the lower surface of the metal frame 108 may overlap as viewed from above. In this case as well, the inner periphery of the upper surface of the metal frame 108 is nearer the mount 102. Thus, accurate positional information can be obtained by image recognition as described above. FIG. 7 is a cross-sectional view of a modification of the package shown in FIG. 6. The frame-shaped metallized layer 106 formed along the outer periphery of the flat insulating substrate 101 as shown in FIG. 7 has the same advantageous effects as described above. The metal frame 108 may have its lower surface narrower than its upper surface as viewed in longitudinal section and has its outer peripheral surface tilted outwardly from the lower end to the upper end. This increases the sealing width of the brazing material 107, and prevents wiring board portions on the mother substrate from being joined to each other with the brazing material 107. Thus, more accurate positional information can be obtained by image recognition.

Figure 8A:
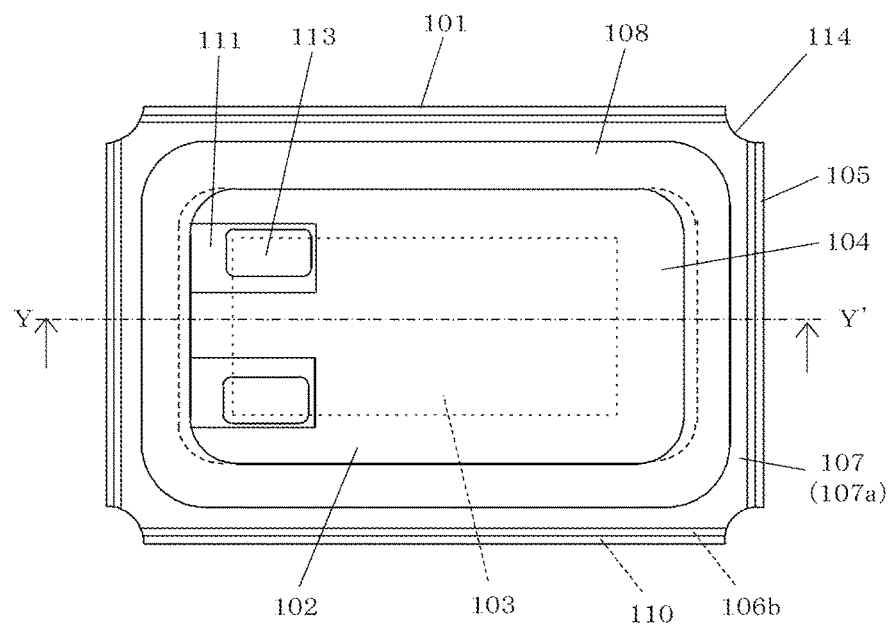
FIG. 8A is a top view of another modification of the package shown in FIG. 6.
Figure 8B:
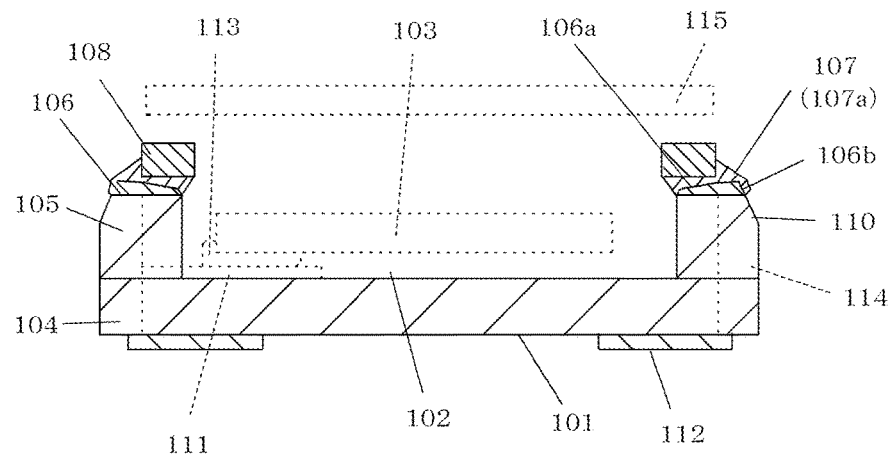
FIG. 8B is a cross-sectional view taken along line Y-Y'.

Even smaller electronic component housing packages include a very narrow frame body, and a narrower portion (frame body) between a mount and the external environment. As shown in FIGS. 8A and 8B, for example, the frame body 105 has opposing short sides that are narrower in the width direction. However, the metal frame 108 has the inner periphery nearer the mount 102 than the inner periphery of the frame-shaped metallized layer 106. Thus, on each short side of the frame body 105 narrower in the width direction, the joint area between the metal frame 108 and the frame-shaped metallized layer 106 is as large as the joint area of each of the opposing long sides. The electronic component housing package thus has highly reliable hermetical sealing with the lid 115 while maintaining the mountability of the electronic component 103 onto the mount 102.

As described above, the multi-piece wiring substrate according to the embodiment includes the multiple arranged wiring board portions that are to be the electronic component housing packages on the mother substrate. This structure allows efficient manufacture of electronic component housing packages each including the brazing structure of the metal frame 108 and the mount 102 with high hermetical sealing.

The mother substrate is, for example, a flat plate with one side of about 60 to 120 mm. For ease of processing, the outer periphery of the mother substrate has a margin with a width of about 5 to 10 mm. The mother substrate including the wiring board portions or the multi-piece wiring substrate is separated into individual pieces with, for example, the method described below. The mother substrate is first sandwiched between an upper pressing roller and a lower conveyor roller. The conveyor roller functioning as fulcrums and the pressing roller functioning as points of application of force are used to separate the multi-piece wiring substrate along the separation grooves 120 into wiring board portions. The distance from the center of the conveyor roller shaft to the center of the press roller shaft as viewed from above is determined in accordance with the length of one side of each wiring board portion. The conveyor roller and the press roller are arranged in contact with endless belts. When the mother substrate sandwiched between the upper and lower endless belts is conveyed, the conveyor roller functions as fulcrums, and the press roller functions as points of application of force. Then, the mother substrate above the conveyor roller is snapped along the separation grooves 120 and is separated into individual pieces.

The laser 118 may be applied along the boundaries 119 between wiring board portions on the unfired laminate that is to be the mother substrate. The laser application causes ablation (loss of a part of a material by evaporation or erosion) to form the separation grooves 120 on the frame-shaped metallized layer 106 and the unfired frame body 105 that is to be the insulating layer.

The second sloping portion 106b and the third sloping portion 110 are then formed using, for example, the procedure described above. This forms the separation grooves 120 with an intended shaped and a large opening and with reduced adhesion during firing. Thus, when the mother substrate is separated into individual wiring board portions, this structure reduces faults such as burrs, chips, and hollows that can easily occur on the side surfaces of each wiring board.

The method for manufacturing the electronic component housing package according to the embodiment of the present invention includes the processes described below. The method includes a process of preparing a continuous substrate as a mother substrate, where the continuous substrate includes a laminate including a plurality of longitudinally and laterally arranged wiring board portions and a frame-shaped metallized layer 106 arranged on an upper surface of the laminate, each wiring board portion has an upper surface including a mount 102, the frame-shaped metallized layer 106 extends along a boundary 119 between the wiring board portions and is convex upward in longitudinal section in a width direction; a process of applying laser light 118 to the continuous substrate through the frame-shaped metallized layer 106 to form separation grooves 120 in the upper surface of the laminate and to form a first sloping portion 106a sloping inwardly from the upper surface to an inner peripheral surface; a process of forming, on an outer peripheral surface of the frame-shaped metallized layer 106a, a second sloping portion 106b sloping outwardly from an upper end to a lower end of the outer peripheral surface of the frame-shaped metallized layer 106, and a third sloping portion 110; a process of forming a fillet portion 107a of a brazing material 107 between an upper outer periphery of the frame-shaped metallized layer 106 and a metal frame 108, and a filling portion 107b that is filled with the brazing material 107 between the first sloping portion 106a and the metal frame 108, and joining the frame-shaped metallized layer 106 to the metal frame 108 with the brazing material 107; a process of covering the second sloping portion 106b of the frame-shaped metallized layer 106 with the brazing material 107; and a process of separating the wiring board portions along the separation grooves 120.

With this manufacturing method, the laminate (mother substrate), or the electronic component housing package according to the embodiment described above including the frame-shaped metallized layer 106 having the second sloping portion 106b and the third sloping portion 110 can be easily formed by laser processing. For smaller electronic component housing packages, this method allows hermetical sealing of the mount 102 and prevents adjoining wiring board portions from joining to each other with the brazing material 107, and allows manufacture of the electronic component housing packages with good productivity and highly reliable hermetical sealing.

In the multi-piece wiring substrate in the embodiment, the intersections of the boundaries 119 between the wiring board portions have through-holes that are to be the castellations 114 of the individual electronic component housing packages.

The method for manufacturing the electronic component housing package will now be described in detail with reference to the cross-sectional views of FIGS. 9A to 9D.

Figure 9A:
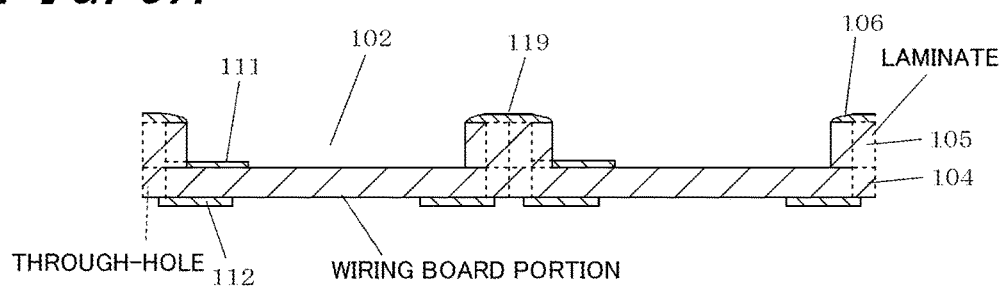
FIGS. 9A to 9D are cross-sectional views sequentially illustrating main processes of a method for manufacturing an electronic component housing package according to the embodiment of the present invention.

FIG. 9A shows the process of preparing the continuous substrate (with no reference numeral) having the multiple longitudinally and laterally arranged wiring board portions with the mount 102 on the upper surface of each wiring board portion, and the frame-shaped metallized layer 106 (metal paste) provided along each boundary 119 between the wiring board portions on the upper surface of the laminate. Although the frame-shaped metallized layer 106 in the process shown in FIG. 9A is a metal paste that is unfired in the embodiment, no specific distinction is performed whether the paste is fired or unfired.

In FIG. 9A, the separation grooves 120 have yet to be formed. The adjoining wiring board portions have the common integrated frame bodies 105. The frame bodies 105 have the frame-shaped metallized layers 106 on their upper surfaces. The frame-shaped metallized layers 106 are also integrated over the adjoining wiring board portions. The integrated frame-shaped metallized layers 106 (metal paste) are convex upward in longitudinal section. The convex shape may be adjusted as appropriate by changing, for example, the viscosity of the metal paste used in the screen printing.

In the example shown in FIGS. 9A to 9D, the through-holes are, for example, punched in the multi-piece wiring substrate. The through-holes may also be formed by laser processing.

Figure 9B:
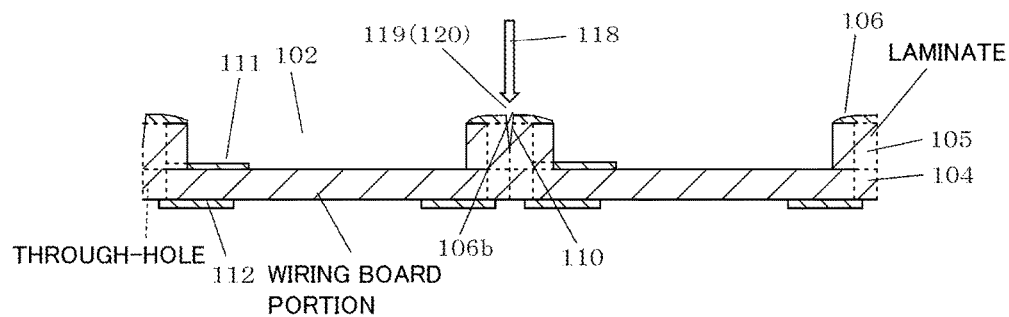

FIG. 9B shows the process of applying the laser 118 to the continuous substrate through the frame-shaped metallized layer 106 to form the separation groove 120 in the upper surface of the laminate and to form the second sloping portion 106b sloping outwardly from the upper end of the outer peripheral surface to the lower end on the outer peripheral surface of the frame-shaped metallized layer 106, and the third sloping portion 110. The laser 118 is applied to the laminate including the longitudinally and laterally arranged wiring board portions along the boundary 119 between the wiring board portions through the upper surface of the frame-shaped metallized layer 106 to form the separation groove 120.

The application of the laser 118 forms the separation groove 120 with inner surfaces sloping downwardly from the upper end of the frame-shaped metallized layer 106 and the insulating substrate 101. This frame-shaped metallized layer 106 covers both the adjoining wiring board portions. In other words, the frame-shaped metallized layer 106 also covers a portion of the boundary 119 between the wiring board portions (in which the separation groove 120 is formed). The sloping inner surfaces of the formed groove 120 correspond to the second sloping portion 106b and the third sloping portion 110.

In this case, the separation groove 120 is formed with the laser 118 when the substrate is a laminate of multiple ceramic sheets, or an unfired laminate that is to be a mother substrate. Forming the separation grooves 120 in the unfired laminate with the laser 118 provides good processability and avoids adhesion of a melt resulting from the laser processing.

The sloping inner surfaces of the formed groove 120 correspond to the second sloping portion 106b and the third sloping portion 110. This method thus forms the separation grooves 120 with reduced adhesion during firing. More specifically, the laser 118 causes ablation to form the separation grooves 120 on the frame-shaped metallized layer 106 and the unfired frame body 105 that is to be the insulating layer. The resultant grooves 120 have an intended shaped and a large opening. In addition, the laser processing with a narrow pulse width has high reliability and generates less heat in the processed workpiece. This method thus forms the separation grooves 120 with a width of tens of micrometers through micromachining while generating little melt. Thus, the electronic component housing package has the accurate outer dimensions and reduces faults such as burrs, chips, and hollows.

Figure 9C:
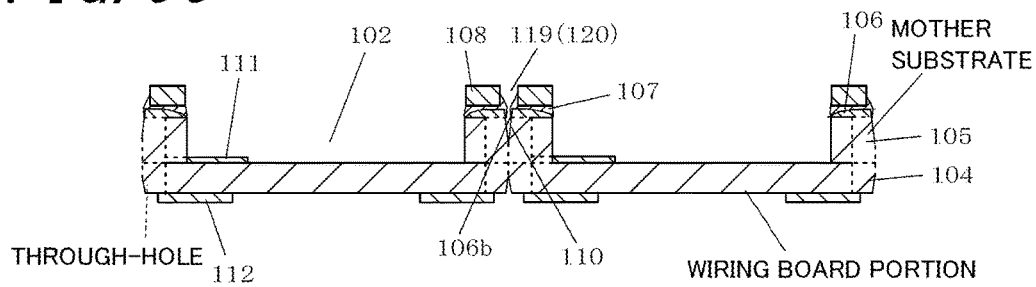

FIG. 9C shows the process of forming the fillet portion 107a of the brazing material 107 between the upper outer periphery of the frame-shaped metallized layer 106 and the metal frame 108, and forming the filling portion 107b that is filled with the brazing material 107 between the first sloping portion 106a and the metal frame 108, and joining the frame-shaped metallized layer 106 to the metal frame 108 with the brazing material 107. FIG. 9C also shows the process of covering the second sloping portion 106b of the frame-shaped metallized layer 106 with the brazing material 107. After the process shown in FIG. 9B, the continuous substrate including the unfired laminate is fired. The metal frame 108 integrated with the brazing material 107 is placed, using a tool, on the upper surface of each frame-shaped metallized layer 106 formed on the fired mother substrate. The brazing material 107 is then melted by heating in a reducing atmosphere to braze the frame-shaped metallized layer 106 with the metal frame 108.

The first nickel plating layer 116 may be preliminarily deposited on the exposed surface of the frame-shaped metallized layer 106 including the second sloping portion 106b. For example, molten brazing material (not shown) flows along the first nickel plating layer 116. As a result, the brazing material 107 spreads over the lower surface and the outer peripheral surface of the metal frame 108 or the exposed surface of the frame-shaped metallized layer 106 including the first sloping portion 106a. The frame-shaped metallized layer 106 also includes the second sloping portion 106b on its outer peripheral surface. The second sloping portion 106b is covered with the brazing material 107. The brazing material 107 thus spreads over an area larger than in structures known in the art from the outer surface of the metal frame 108 to the outer peripheral surface of the frame-shaped metallized layer 106. Thus, the joint area including the metal frame 108 is wider in appearance. More specifically, the width of the joint area between the metal frame 108 and the frame-shaped metallized layer 106 (the distance from the inner periphery to the outer periphery of the joint between the metal frame 108 and the frame-shaped metallized layer 106) can be effectively larger than in structures known in the art. The frame-shaped metallized layer 106 includes the second sloping portion 106b, and thus the brazing material 107 on the lower surface of the metal frame 108 easily spreads from the upper surface of the frame-shaped metallized layer 106 to the second sloping portion 106b on the outer periphery in accordance with the slope.

The third sloping portion 110 is a part of the insulating substrate 101, which is an uncovered ceramic area, and thus is not joined to the brazing material 107. Additionally, the adjoining wiring board portions have the separation grooves 120 formed with the laser 118 between them. This structure prevents the frame-shaped metallized layers 106 on the adjoining wiring board portions from joining to each other with the brazing material 107. As shown in FIG. 9C, the separation grooves 120 may also be formed on the lower surface at positions overlapping the separation grooves 120 formed on the upper surface as viewed from above. This eases the separation of the mother substrate further.

In the mother substrate having the wiring board portions to which the metal frame 108 has been joined with the brazing material 107, the second nickel plating layer 117 and the gold plating layer (not shown) are deposited one after the other on the exposed surface of the brazed metal (exposed surface of, for example, the frame-shaped metallized layer 106, the wiring conductor 111, or the metal frame 108) to improve the corrosion resistance and the joining with solder. As a result, the surface of the joined brazing material 107 covering the second sloping portion 106b is covered with the second nickel plating layer 117 as shown in, for example, FIGS. 3 and 4. This further prevents the splattering of the brazing material 107 due to remelting during the joining of the metal lid 115 to the metal frame 108 by, for example, seam welding. The brazing material 107 joined to the second sloping portion 106b is thin, and thus particularly benefits from this structure.

Figure 9D:
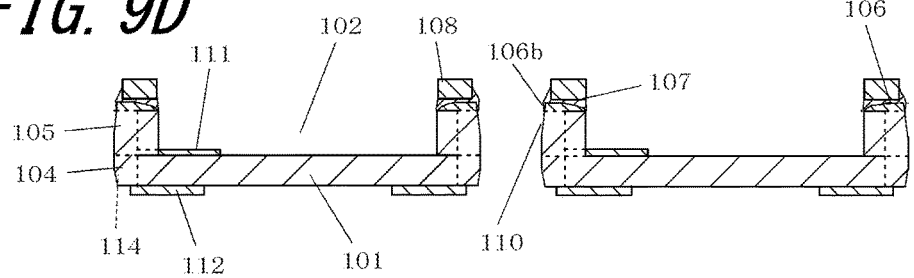

FIG. 9D shows the process of separating the wiring board portions along the separation grooves 120. To separate the mother substrate into the individual wiring board portions, as described above, the mother substrate is first sandwiched between an upper pressing roller and a lower conveyor roller. The conveyor roller functioning as fulcrums and the pressing roller functioning as points of application of force are used to separate the mother substrate along the separation grooves 120 into wiring board portions. For smaller wiring board portions (individual electronic component housing packages), this method allows hermetical sealing of the mount 102 and prevents adjoining wiring board portions from joining to each other with the brazing material 107. Thus, for example, the method allows manufacture of electronic component housing packages with good separation in the multi-piece wiring substrate, and allows manufacture of the electronic component housing packages with good productivity and highly reliable hermetical sealing.

The resultant separate electronic component housing package includes the frame-shaped metallized layer 106 having the second sloping portion 106b on its outer peripheral surface, and the second sloping portion 106b covered with the brazing material 107. More specifically, the brazing material 107 spreads over an area larger than in structures known in the art from the outer surface of the metal frame 108 to the outer peripheral surface of the frame-shaped metallized layer 106. Thus, the joint area including the metal frame 108 can be wider. The joint, which can possibly cause external air to pass through and reach the mount 102 due to poor wetting of the brazing material 107, can be easily designed longer than in structures known in the art. This structure thus improves the hermetical sealing of the mount 102. The resultant electronic component housing package includes the mount 102 with high hermetical sealing.

The electronic component housing package, the multi-piece wiring substrate, and the method for manufacturing the electronic component housing package according to embodiments of the present invention are not limited to the examples described in the above embodiment. The embodiment may be changed variously without departing from the spirit and scope of the invention. For example, although the frame body 105 of the insulating substrate 101 in the above embodiment is a monolayer, the frame body 105 of the insulating substrate 101 may include two or more layers. In this case, the third sloping portion 110 defining the frame body 105 may extend across the interface between the opposing layers included in the insulating layer. Additionally, although the frame-shaped metallized layer 106 in the above embodiment is a monolayer, the frame-shaped metallized layer 106 may include two or more layers. To split the frame-shaped metallized layer 106 into two, the boundary area may be thicker than its outer periphery. In this case, the frame-shaped metallized layer 106 can easily have its thickness increasing from the mount 102 toward the outer periphery.

REFERENCE SIGNS LIST 101 insulating substrate
102 mount
103 electronic component
104 base
105 frame body
106 frame-shaped metallized layer
106a first sloping portion
106b second sloping portion
107 brazing material
107a fillet portion
107b filling portion
108 metal frame
110 third sloping portion
111 wiring conductor
112 external connection conductor
113 bond
114 castellation
115 lid
116 first nickel plating layer
117 second nickel plating layer
118 laser
119 boundary
120 separation groove
θ1 tilt angle at the outer peripheral surface of the metal frame
θ2, θ3 tilt angle at the inner peripheral surface of the metal frame

The invention claimed is:

1. An electronic component housing package, comprising:
an insulating substrate having an upper surface including a mount for an electronic component;
a frame-shaped metallized layer surrounding the mount on the upper surface of the insulating substrate; and
a metal frame joined to the frame-shaped metallized layer with a brazing material,
wherein the frame-shaped metallized layer includes a first sloping portion sloping inwardly from an upper surface to an inner peripheral surface, and
the brazing material includes a fillet portion formed between an upper outer periphery of the frame-shaped metallized layer and the metal frame, and a filling portion formed between the first sloping portion and the metal frame.

2. The electronic component housing package according to claim 1, wherein
the frame-shaped metallized layer includes, on an outer peripheral surface, a second sloping portion sloping outwardly from an upper end to a lower end of the outer peripheral surface, and
the brazing material covers the second sloping portion of the frame-shaped metallized layer.

3. The electronic component housing package according to claim 1, wherein
the second sloping portion of the frame-shaped metallized layer has a lower end in contact with an outer periphery of the upper surface of the insulating substrate, and the insulating substrate includes, on an outer peripheral surface, a third sloping portion continuous to the second sloping portion.

4. The electronic component housing package according to claim 1, wherein
the frame-shaped metallized layer includes an outer peripheral portion that is thicker than a portion adjacent to the mount of the insulating substrate.

5. The electronic component housing package according to claim 1, wherein
the metal frame has a lower surface that is narrower than an upper surface as viewed in longitudinal section, and the metal frame has an outer peripheral surface tilted outwardly from a lower end to an upper end.

6. The electronic component housing package according to claim 1, wherein
the metal frame has an inner peripheral surface tilted inwardly from a lower end to an upper end as viewed in longitudinal section.

7. The electronic component housing package according to claim 5, wherein
the metal frame has an inner peripheral surface tilted inwardly from a lower end to an upper end as viewed in longitudinal section, and the metal frame has an inner peripheral surface tilt that is smaller than an outer peripheral surface tilt as viewed in longitudinal section.

8. The electronic component housing package according to claim 1, wherein
the metal frame has an inner periphery nearer the mount than an inner periphery of the frame-shaped metallized layer.

9. A multi-piece wiring substrate, comprising:
a mother substrate including a plurality of wiring board portions corresponding to a plurality of the electronic component housing packages according to claim 1.

10. A method for manufacturing an electronic component housing package, the method comprising:
preparing a continuous substrate as a mother substrate, the continuous substrate including a laminate including a plurality of longitudinally and laterally arranged wiring board portions and a frame-shaped metallized layer arranged on an upper surface of the laminate, each wiring board portion having an upper surface including a mount, the frame-shaped metallized layer extending along a boundary between the wiring board portions and being convex upward in longitudinal section in a width direction;
applying laser light to the continuous substrate through the frame-shaped metallized layer to form separation grooves in the upper surface of the laminate and to form a first sloping portion sloping inwardly from the upper surface to an inner peripheral surface;
forming a fillet portion of a brazing material between an upper outer periphery of the frame-shaped metallized layer and a metal frame, and a filling portion that is filled with the brazing material between the first sloping portion and the metal frame, and joining the frame-shaped metallized layer to the metal frame with the brazing material; and
separating the wiring board portions along the separation grooves.

11. The method according to claim 10, further comprising:
forming a second sloping portion on an outer peripheral surface of the frame-shaped metallized layer and forming a third sloping portion on a side surface of the laminate exposed in the separation grooves, the second sloping portion sloping outwardly from an upper end to a lower end of the outer peripheral surface; and
covering the second sloping portion of the frame-shaped metallized layer with the brazing material.

* * * * *